United States Patent [19]
Forslund

[11] Patent Number: 5,455,899
[45] Date of Patent: Oct. 3, 1995

[54] HIGH SPEED IMAGE DATA PROCESSING CIRCUIT

[75] Inventor: Donald C. Forslund, Wappingers Falls, N.Y.

[73] Assignee: International Business Machines Corporation, Armonk, N.Y.

[21] Appl. No.: 999,323

[22] Filed: Dec. 31, 1992

[51] Int. Cl.⁶ .................................................. G06F 15/00
[52] U.S. Cl. ............................................................ 395/140
[58] Field of Search .................................. 395/155, 161, 395/141, 142; 382/41, 46, 47, 48; 345/133, 134, 135; 364/715.04, 715.03, 715.01

[56] References Cited

U.S. PATENT DOCUMENTS

| | | | |
|---|---|---|---|
| 4,424,588 | 1/1984 | Satoh et al. | 382/48 |
| 4,499,597 | 2/1985 | Alves | 382/41 |
| 4,625,330 | 11/1986 | Higgins | 382/27 |
| 4,703,513 | 10/1987 | Gennery | 382/27 |
| 4,707,610 | 11/1987 | Lindow et al. | 250/560 |
| 4,818,110 | 4/1989 | Davidson | 356/358 |
| 4,845,356 | 7/1989 | Baker | 250/225 |
| 4,918,636 | 4/1990 | Iwata et al. | 364/715 |
| 4,925,302 | 5/1990 | Cutler | 356/128 |
| 4,963,018 | 10/1990 | West | 356/1 |
| 4,979,221 | 12/1990 | Perryman et al. | 382/1 |
| 5,016,173 | 5/1991 | Kenet et al. | 364/413 |
| 5,030,008 | 10/1991 | Scott et al. | 356/394 |
| 5,054,926 | 10/1991 | Dabbs et al. | 356/345 |
| 5,168,554 | 12/1992 | Luke | 395/161 |

*Primary Examiner*—Phu K. Nguyen
*Attorney, Agent, or Firm*—Whitham, Curtis, Whitham & McGinn; Harold Huberfeld

[57] ABSTRACT

An image data processing circuit achieves high speed by storing precomputed values for each combination of pairs or groups of inputs at each of a normalization, parabola fitting, arbitration, selection and anti-aliasing stages. Normalization of input values, possibly together with data truncation, as a first stage permits the use of small memories having identical contents in each stage of the processor.

29 Claims, 6 Drawing Sheets

| RPP | a | b | c | d | CONDITION |
|---|---|---|---|---|---|
| * | 0 | 1 | 1 | 1 | NEGATIVE SLOPE |
| * | 0 | 1 | 1 | 0 | PLATEAU |
| — | 0 | 1 | 0 | 1 | DON'T CARE |
| +4 | 0 | 1 | 0 | 0 | |
| +3 | 0 | 0 | 1 | 1 | |
| +2 | 0 | 0 | 1 | 0 | |
| +1 | 0 | 0 | 0 | 1 | |
| 0 | 0 | 0 | 0 | 0 | PEAK POSITION |
| -1 | 1 | 1 | 1 | 1 | |
| -2 | 1 | 1 | 1 | 0 | |
| -3 | 1 | 1 | 0 | 1 | |
| -4 | 1 | 1 | 0 | 0 | |
| — | 1 | 0 | 1 | 1 | DON'T CARE |
| — | 1 | 0 | 1 | 0 | DON'T CARE |
| * | 1 | 0 | 0 | 1 | POSITIVE SLOPE |
| * | 1 | 0 | 0 | 0 | VALLEY |

DOUBLE RPP RANGE

| | 0100 | 0101 | 0110 | 0111 | |
|---|---|---|---|---|---|
| 000 | 0010000 | 0010001 | 0010010 | 0010011 | |
| 001 | 0001111 | 0010000 | 0010001 | 0010010 | |
| 010 | 0001110 | 0001111 | 0010000 | 0010001 | |
| 011 | 0001101 | 0001110 | 0001111 | 0010000 | |
| 100 | 0001100 | 0001101 | 0001110 | 0001111 | |
| 101 | 0001011 | 0001100 | 0001101 | 0001110 | |
| 110 | 0001010 | 0001011 | 0001100 | 0001101 | |
| 111 | 0001001 | 0001010 | 0001011 | 0001100 | |

3 - BIT PHASE

HIGH SPEED IMAGE DATA PROCESSING CIRCUIT

BACKGROUND OF THE INVENTION

1. Field of the Invention

The present invention generally relates to special purpose data processing circuits and, more particularly, to data processing circuits for image data in automated inspection systems.

2. Description of the Prior Art

Image processing for display generation or feature measurement, extraction or recognition is perhaps the most computationally and storage intensive category of data processing problem commonly encountered at the present time. Feature measurement, such as in measurement of cell features in biological applications and the monitoring of coating or layering processes are two examples of applications of automatic feature measurement which require high-speed computation of high accuracy feature measurement data. While the actual processing may be quite simple in some cases, such problems typically involve relatively massive amounts of data. For example, consider that the smallest unit of an image for processing is referred to as a pixel with which the image surface is tiled, often in the form of a matrix. If the resolution of the image is a matrix of one thousand pixels on a side, the complete image will include one million pixels. Each pixel may further contain data representing images values such as color, hue and saturation and other data which represents the relationship to other pixels such as an object number or a location in a three-dimensional scene. The number of bits of such image value information must be multiplied by the number of pixels in the image to obtain the number of bits necessary to represent the image. Since some operation may be required on any or all of this image data, it can be understood that many millions of data processing operations are required for even modest degrees of spatial and image value resolution.

Accordingly, many approaches have been tried in recent years to reduce the amount of data which must be processed in order to achieve desired levels of throughput from image processing apparatus. Nevertheless, even with high-speed computers, possibly including special purpose co-processors and pipelined architectures, it is not uncommon for the processing of a single image to require several hours to complete. In the field of automated inspection systems, such processing times present a major limitation on throughput of manufacturing processes. However, in some manufacturing fields, such as the manufacturing of electronic circuit devices at high integration densities, there is no viable alternative to automated inspection.

Therefore, the art of image feature measurement, extraction and/or recognition has generally advanced through the development of special purpose image transducers and processing arrangements which are specifically adapted to particular kinds of image features. For example, U.S. Pat. No. 4,424,588 to Satoh, describes processing to detect the position of a symmetrical article. U.S. Pat. No. 4,499,597, to Alves, describes centroid accumulation for small object detection. Pixel values are compared among adjacent pixels to determine the maximum image value pixel in a character segment in U.S. Pat. No. 4,625,330, to Higgins and a similar neighborhood comparison is disclosed in Gennery, U.S. Pat. No. 4,703,513; both being directed to the enhancement of video signals. An arrangement for imaging a three-dimensional device applied to lead frame assembly is disclosed in U.S. Pat. No. 5,030,008, to Scott et al. An optical system for distance measuring is disclosed in U.S. Pat. No. 5,054,926, to Dabbs et al. Some exemplary data processing arrangements for use in image processing systems are also disclosed in U.S. Pat. Nos. 5,016,173, to Kenet et al, 4,918,636, to Iwate et al., 4,963,018, to West, 4,979,221, to Perryman et al., 4,925,302, to Cutler, 4,845,356, to Baker, 4,818,110, to Davidson, and 4,707,610, to Ludlow et al.

This latter patent to Ludlow et al. is directed to the measuring of surface profiles and line width measurements in regard to the manufacture of integrated circuit devices. The wafer to be measured is mounted for oscillatory movement and an optical system focusses a beam on a small spot on the surface. The spot is scanned along the wafer while the focus is progressively changed to derive a series of samples of the surface profile.

More recently, however, it has become desirable to measure a plurality of reflecting profiles within a body of material such as would be presented by a plurality of layers of a semiconductor structure. In such imaging, it may not be possible to, say, follow each profile separately and differentiation of profiles may be difficult. Also, since multiple scanning is relatively slow and potentially could engender positional errors in connection with the different surfaces imaged, it is desirable to sense all profiles in a single scan of the object to be imaged.

At the present state of the art in optical transducers (e.g. electronic cameras), spatial resolution over the surface (e.g. the x and y directions) of the device and within (e.g. in the z direction) the device is on the order of one-quarter micron. Therefore, even a small surface such as that of a chip may involve several million pixels and the profile information may desirably reach the resolving of, say, eight surfaces at eight bits dimensional accuracy. Bit streams of data from each surface are essentially derived simultaneously, in parallel, for each pixel. Accordingly, it is seen that an extremely great quantity of data must be captured, stored and processed to exploit the capabilities of transducers presently available and to accomplish the desired imaging.

Consider also that some attempts to increase processing speed have involved truncation of data. However, such truncation effectively discards information which is present in the original signals from a transducer device. Even truncation is of extremely limited value in reducing data since it is now common to produce integrated circuits having several millions of components, each of which must be imaged with sufficient resolution for meaningful inspection, requiring several pixels for each component or feature of a component. Therefore, data truncation, even to one bit per pixel, is very much limited by the minimum amount of data which is required to achieve the desired inspection function.

In summary, the present state of the data processing art does not allow full exploitation of the capabilities of optical transducers now possible or allow real time processing of such large amounts of data as are required for a desired degree of optical resolution and with sufficient throughput to provide an automated, real time, inspection system suitable for present manufacturing systems for high density integration electronic components.

SUMMARY OF THE INVENTION

It is therefore an object of the present invention to provide a processor for image data which provides for greatly reduced storage, and improves the data for subsequent processing while retaining the full resolution information originally present in the image data.

It is another object of the invention to provide a technique of data reduction which does not cause loss of resolution of the original data.

It is a further object of the invention to provide an anti-aliasing function to correct time-varying errors, such as cyclic transducer output variation, particularly in combination with data compression.

It is yet another object of the invention to provide data compression and/or anti-aliasing at enhanced speeds without loss of resolution.

It is a particular object of the invention to provide a distance or height processor for imaging a plurality of surfaces or objects in a line-of-sight direction at each pixel location within a field of view which provides data representing locations of features on surfaces or interfaces from samples of locations of such surfaces or interfaces.

In order to accomplish these and other objects of the invention, a data processor is provided including means for receiving a plurality of parallel inputs and normalizing means for normalizing at least one of said plurality of parallel inputs by an adjacent one of said plurality of parallel inputs.

In accordance with another aspect of the invention, a data processor is provided including first means for receiving a plurality of inputs in parallel and producing a first plurality of outputs in response thereto, each of the first plurality of outputs corresponding to respective pairs of inputs, second means for receiving first outputs of the first means in parallel and producing a second plurality of outputs in response thereto, each of the second outputs corresponding to respective pairs of first outputs, and third means for receiving outputs of the second means in parallel and producing a third plurality of outputs in response thereto, each output of said third plurality of outputs corresponding to respective groups of the second outputs.

In accordance with a further aspect of the invention, a data processing method is provided including the steps of normalizing each of a plurality of inputs by accessing a precomputed value with respective pairs of a plurality of parallel inputs and determining at least one location by parabola fitting by accessing a precomputed value with respective pairs of results of the normalizing step.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
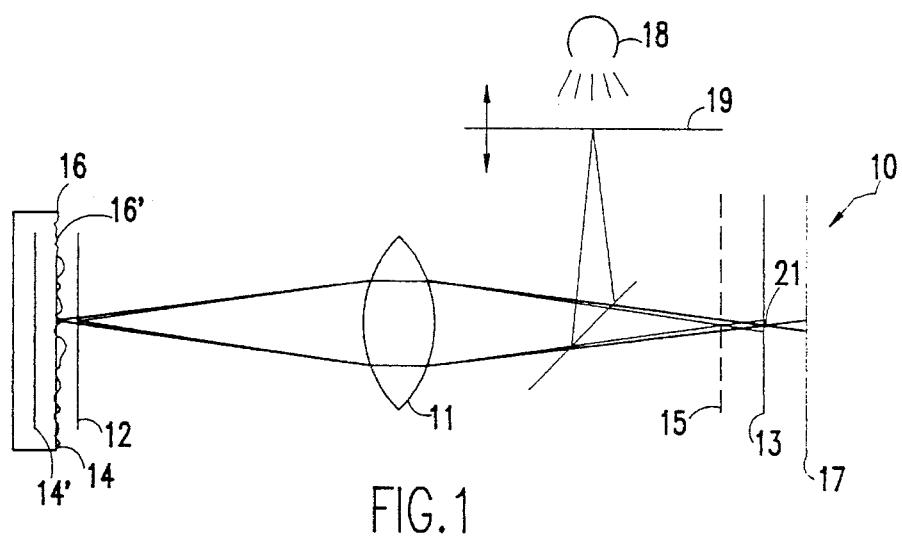
FIG. 1 is a schematic illustration of a confocal depth imaging arrangement.

Referring now to the drawings, and more particularly to FIG. 1, there is shown, in schematic form, a confocal optical depth measurement system 10 as used with the present invention. The basic principle of confocal depth measurement is that a simple lens or a lens system 11 will have both front and rear focal planes. That is, an image of an object a given distance from the lens center will be brought into best focus on the opposite side of the lens at a known distance from the center of the lens related to the focal length of the lens. For example, an object at plane 12 will be brought into best focus at plane 13 and an object in plane 14 will be brought into best focus at plane 15. Thus, pairs of planes are generated at distance from the center of lens 11 which are referred to as confocal points.

In order to measure the height of points on a variable height surface 16' of an object 16, a focussed spot of radiant energy illumination from source 18 is formed at a point on or near the surface 16'. This is normally done by varying the position of pinhole aperture 19 to vary the position of the focussed point of light in the z direction over a range generally indicated by 12 and 14'. This is done to avoid a requirement for sensing best focus at the surface being measured.

The reflection from surface 16' is then focussed at the point which is confocal to the position in the z direction at which the currently illuminated position on object 16 is focussed. If a pinhole aperture 21 is also moved through a range of planes corresponding to the confocal points of heights of best focus of the image of pinhole 18, small changes in height of the surface 16' result in large swings in the amount of light reaching transducer plane 17 through aperture 21 because maximum transmission of light through the pinhole 21 will only occur when the plane of pinhole 21 is confocal to the distance of the surface 16' from the lens center. For example, light reflected from plane 14 is brought into best focus at plane 15 and the image at the particular pinhole plane 13, illustrated in FIG. 1 is larger than the pinhole. Thus the pinhole substantially attenuates the light passing to the transducer plane 17 if the reflected light is defocussed, thus producing a larger image at both surface 16' and pinhole aperture 21. Any defocussing of the image of pinhole 19 at either surface 16' or pinhole 21 thus causes additional attenuation of light reaching a transducer at plane 17.

To increase speed of transducing in a practical embodiment of a camera with which the present invention is preferably employed, the principles of confocal imaging can be carried out in rapid sequence from pixel to pixel with an array of pixel locations of surface 16' being imaged simultaneously at different depths/heights in a manner which is not important to the practice of the present invention. However, for visualization of the nature of the output of the camera, this is done by the provision of multiple pinholes 19 and 21 in a way which produces differing confocal distances for each pair of pinholes and multiple transducers in plane 17; the latter preferably being a spaced array of sensors formed as a charge coupled device (CCD). However, in any sampling cycle, intensity data samples corresponding to, say, sixteen heights (e.g. at respective ones of sixteen pixels) at eight bits precision each are output from the camera at a bit rate substantially exceeding 10 MHz. These sixteen samples are reorganized in a manner disclosed in concurrently filed copending U.S. patent application Ser. No. 07/999,049 (IBM Docket No. FI9- 92-010) to correspond to sixteen heights of the same pixel of surface 16' and output at comparable bit rates. These intensity values for each pixel are then examined to determine the location of confocal response curve peaks which represent reflective surfaces or interfaces. The examination is preferably done by parabola fitting in accordance with the invention.

Figure 2A:
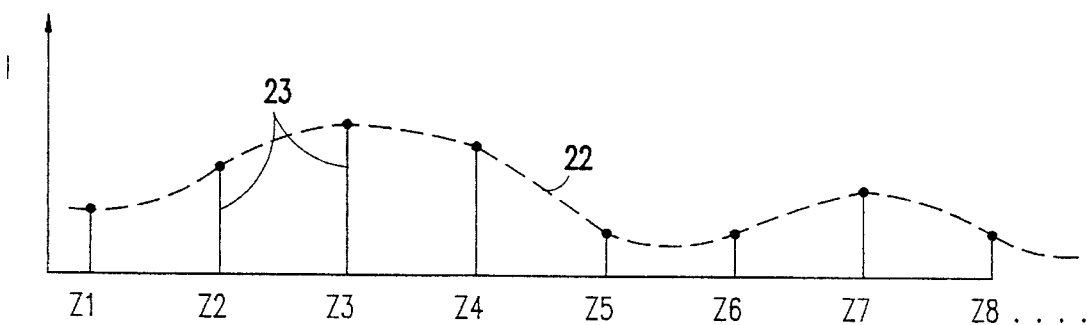
FIGS. 2A and 2B illustrate confocal optical response peak detection and parabola fitting, respectively.

For simplicity of explanation, only eight samples z1–z8 are shown in FIG. 2A, as sampling a confocal response curve 22 which might be produced by continuous confocal imaging. The heights of bars 23 indicates the intensity of reflected light sample at a particular position in the z direction at a particular pixel location. It should be understood that as many height samples as desired could be provided to obtain the desired degree of height resolution. It should also be realized as an incident of the confocal imaging process, that intensity is also a measure of location in the z direction within a region in the vicinity of each sample location where the relationship of the intensity and distance in the z direction can be regarded as predictable. It is also necessary to provide a plurality of bits of intensity resolution in order to capture data from a plurality of reflective interfaces which will produce different fractional reflection intensities. Therefore, the proportionate resolution of intensity and z distance is regarded as preferred for making the observations intended at a resolution of one-quarter micron.

Figure 2B:
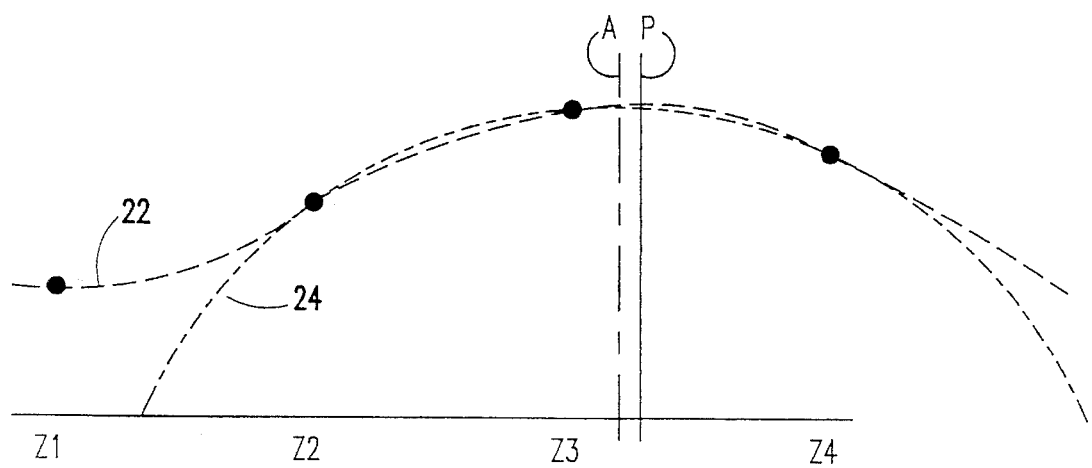

Peak location estimation by parabola fitting is, per se, well-known. Parabola fitting takes, as its basic premise, that a both a peak and a parabola can be defined by three points and that the parabola will be a close approximation of a peak of an arbitrary function over that range, as shown in FIG. 2B in which a portion of curve 22 is enlarged. While a parabola 24 fitted to the I values of locations z2, z3 and z4 rapidly diverges from function 22 outside this range, the parabola closely approximates the curve within the range and the parabola axis A is seen to be a very close approximation of the peak location P. This assumes, of course, that two resolvable peaks cannot reside in the same range, as implied by the spatial frequency of the sampling provided. A parabola fit through any three arbitrary points can be described by a formula of the general quadratic form (in terms of intensity I and location z)

$$I_i = Az_i^2 + Bz_i + C$$

where A, B and C are functions of the intensity values at the locations of $z_{i-1}$, $z_i$ and $z_{i+1}$ relative to the axis of the parabola. In other words, the general solution of quadratic equations may be rearranged to provide an estimate of the relative peak position (RPP) within any group of three points as $$R_{pp} = \frac{4(I_{i+1} - I_{i-1})}{I_{i-1} + I_{i+1} - 2I_i}$$

where the multiplier "4" in the numerator corresponds to the number of resolution subintervals provided on each side of each sample point. This expression of $R_{pp}$ can also be normalized by division by $I_i$. Normalization is significant to the hardware comprising the invention since it allows description of the relative peak position in terms of only two quantities rather than three: $I_{i-1}/I_i$ and $I_{i+1}/I_i$. The absolute position is preserved in the location of any one of the three points and the known spatial distance therebetween and thus may be later recovered. In this regard, it should also be noted that the processor in accordance with the invention is insensitive to the absolute intensity input values due to the normalization function.

Figure 3:
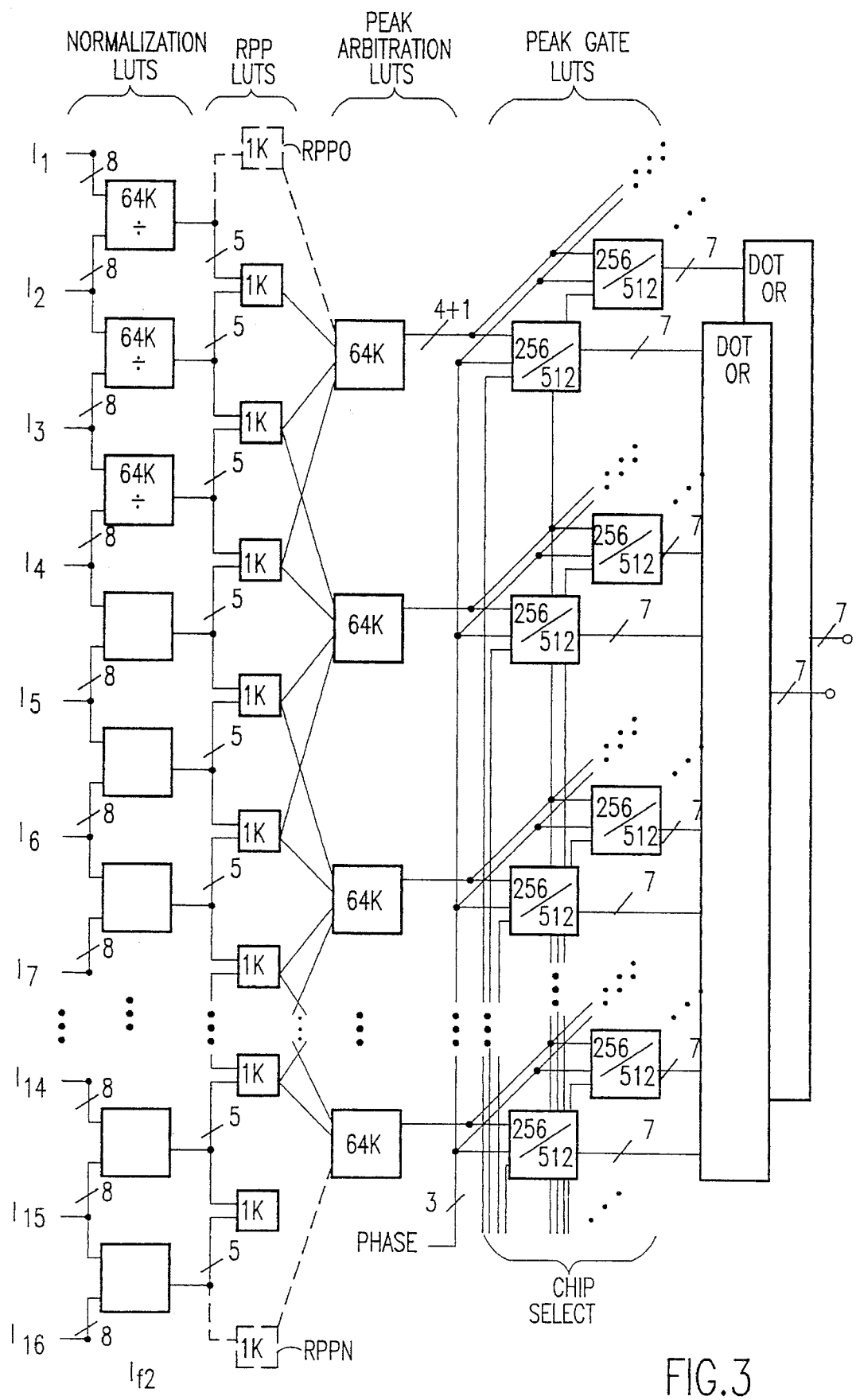
FIG. 3 is a schematic diagram of the processor arrangement in accordance with the invention.
Figure 4:
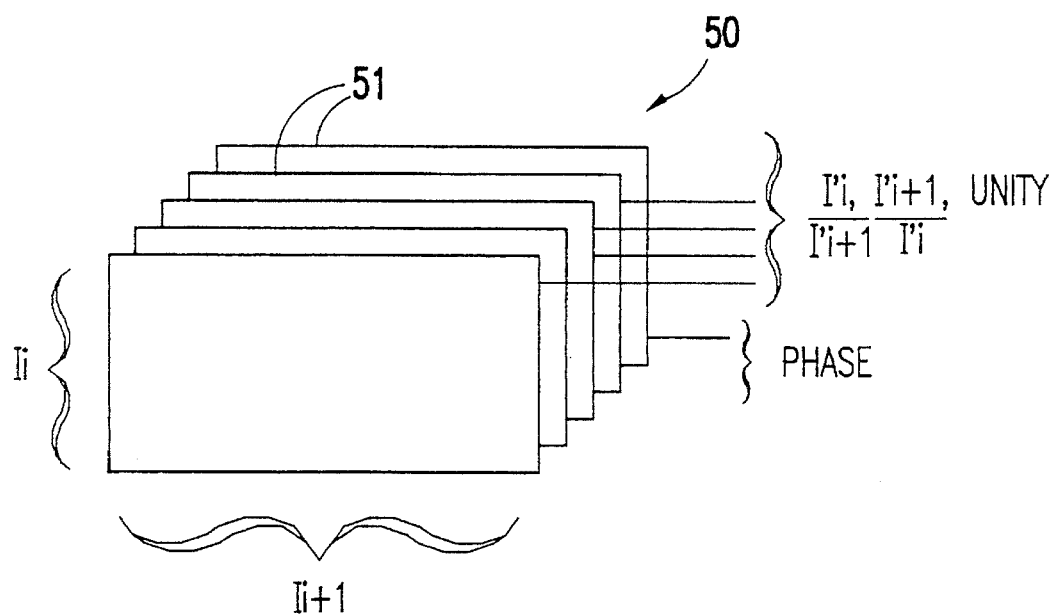
FIG. 4 is a schematic illustration of a normalization look-up table of FIG. 3.
Figure 5:
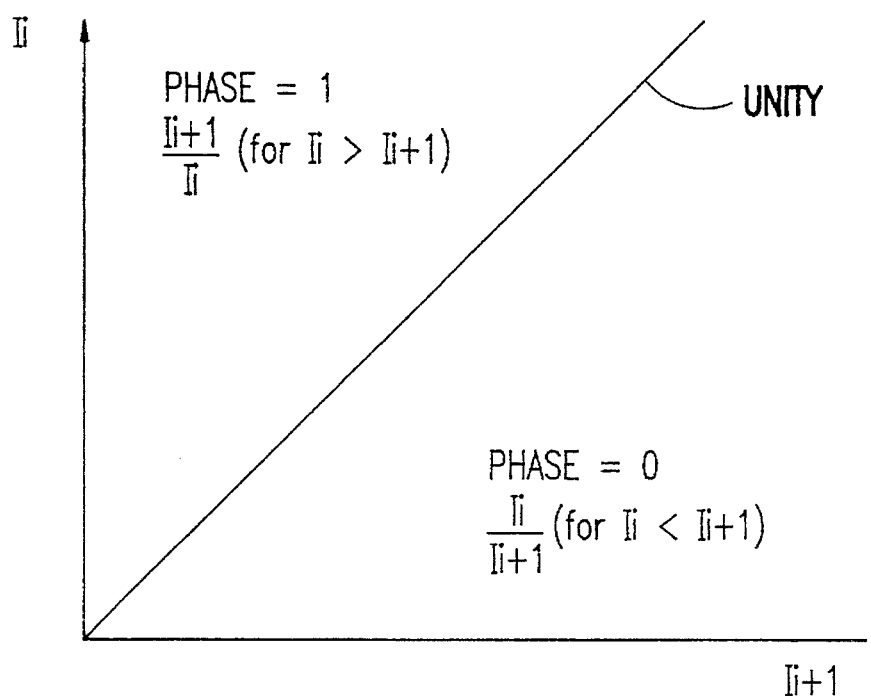
FIG. 5 is a graphical illustration of the function of the normalization look-up table of FIG. 4.

Referring now to FIG. 3, a preprocessor in accordance with the invention is schematically shown. This preprocessor essentially forms a highly parallel four-stage pipeline processor; the stages of which will be described in turn. The first stage of the preprocessor 30 provides a normalizing function preferably by means of a plurality of look-up tables (LUT's), shown in FIG. 4 which are addressed by the respective eight-bit grey scale intensity values. Since these inputs reflect quantized measured values, the quotient is also quantized and all possible values of the quotient may be stored in memory and merely retrieved, rather than requiring performance of division for each set of data. This results in substantial savings in hardware and yields greatly increased speed of operation. The required outputs need only characterize the normalized values at full resolution since some resolution can be recovered as will be discussed later. Therefore only 3, 4, or 5 bits and an additional bit for "phase" of output are required for any addressed location. The use of 4 or 5 bits, depicted as separate memory planes 51 in FIG. 4, is preferred for LUT memory 50 since the corresponding choice of memory structure for the RPP LUT's which will be discussed below is not significantly affected. That is, four bits requires a 1K capacity memory and five bits requires a 4K memory, both of which may be easily provided. In any event, an addressable memory space of 64K is generally suitable for the practice of the invention. The operation of the normalizing LUT's will now be discussed with reference to FIG. 5.

As indicated above, the normalizing LUT's contain quotients of two of the intensity values input to the processor from the camera. It is preferred that these quotients are arranged in the addressable space symmetrically about a 45° line represent a unity value (e.g. coded as 1111 and a phase bit which is arbitrary) and providing that the divisor resulting in the quotient be the larger of the values. Thus, phase indicates whether the slope of the line between the intensity values is positive or negative. Addresses on the unity line generally imply a peak at high address values and a valley at low address values, addresses above the unity line imply a valley to the right of the points and addresses below the line imply a peak between the points or a peak to the right of the points. Since only two values are represented at any given address, these implications are necessarily ambiguous. However, when compared with a third value at the relative peak position LUT's (RPP LUT's), both the existence of a peak, if any, and its position are found.

It must be remembered that the data which might be considered as lost by normalization is, in fact, preserved by the identity of the normalization LUT which corresponds to the sample location. The normalization LUT's can therefore all contain precisely the same quotient and phase values and are preferably identical read-only memories (ROM's) or programmable read-only memories (PROM's) which are identically programmed, thus providing substantial simplification of hardware or the preparation thereof for carrying out the invention.

Referring again to FIG. 3, the following stage of the preprocessor preferably comprises an array of relative peak position (RPP) LUT's. The function of these LUT's is to provide an estimate of the position of the peak by parabola fitting. As with the normalization LUT's, since the input addresses are quantized (normalized intensity) values, the computations for all possible values can be done in advance and the results merely entered in the RPP LUT. It is for this reason also that the values stored in the normalization LUT can be symmetrically arranged with the phase output value indicating whether $I_i$ or $I_{i+1}$ is the divisor. While the value represents actual intensity values, the output of the normalization LUT is only significant to the RPP LUT as addresses, differentiated in a symmetrical fashion by the value of the phase bit. Since actual precomputed values are stored in the RPP LUT, the inversion of the normalization process is immaterial to the value output by the RPP LUT. Further, in comparison with computing particular values, non-linearities of accuracy due to small divisor values are avoided.

Figures 6, 7:
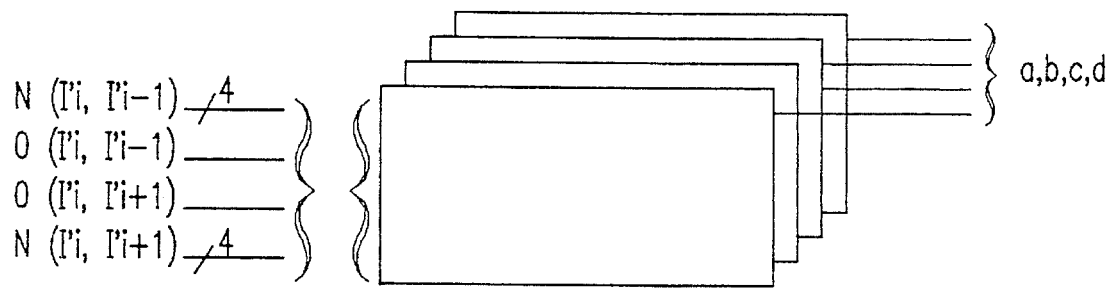
FIG. 6 is a schematic illustration of a relative peak position look-up table of FIG. 3.
FIG. 7 illustrates a preferred coding for entries in the relative peak position look-up table of FIG. 6.

Referring now to FIG. 6, the RPP LUT 60 will now be discussed. Again the preferred structure is illustrated as a plurality of memory planes. The number of RPP LUT's can be one less than the number of normalization LUT's which, in turn, is one less than the number of intensity values input at the design resolution (e.g. the number of values z1–zN). Alternatively, an additional RPP LUT can be added to either or both of the extremes of the RPP LUT array, as shown at RPP0 and RPPN in FIG. 3, and provided with a unity or other fixed input corresponding to an assumed behavior of the confocal response curve 22 beyond the imaged range of depths/heights. Unity would represent a constant value and a non-unity value would represent a constant slope. The addressable space of each need only be equal to the possible number of combinations of bits output by adjacent normalization LUT's, in this case, 32×32 addresses for five bits output by each normalization LUT, and therefore the invention can be carried out using a very small (e.g. 1K) memory. In comparison, it should also be noted in this regard, that if the normalization LUT's were not provided, at least 16 Mbytes of memory would be required for each RPP LUT. The number of planes depends on the number of output codes required, again for the desired degree of resolution. If the preferred coding for eight subintervals is adopted, as shown in FIG. 7, only four bits of output are required. It should be noted in the following discussion that the RPP LUT's are providing a result based on two values just as the normalization LUT's provided a quotient of two values. Since one of the original I values was input to two adjacent normalization LUT's, the outputs of which are now being provided to a single RPP LUT, the three adjacent normalized intensity values, now designated $I'_{j-1}$, $I'_j$ and $I'_{j+1}$ (the "prime" indicating that the value is an address based upon a specially normalized value referred back to an intensity value rather than an intensity value itself), $I'_j$ being the central value of each group of three values centered on $I_j$, which is the intensity value of the same number or subscript.

In FIG. 7, the codes are preferably arranged in numeral order of the values a, b, c and d with an offset such that the relative peak position values are symmetrically arranged about a normalized input sample value $I'_j$ from location $z_j$, corresponding to a=b=c=d=0. In this manner, four subdivisions are provided to the left and right of the central sample value location over half the sample distance interval.

It should be noted that at this point in the processor in accordance with the invention, the relative position of every peak represented in the original data is now represented by, in this example of the preferred embodiment, one of nine possible values of four bits of one of the RPP LUT's. The absolute position is also known from the identity of the RPP LUT and its output. Recalling that the original input data included sixteen samples at eight bits resolution, each, this represents a very substantial and significant reduction in the data upon which further processing will be performed. The further stages of the preferred embodiment of the invention shown in FIG. 3 are thus directed to resolving ambiguities in the reduced data which may result from broad peaks and correction of quantizing errors produced by the particular camera with which the invention is preferably used. The first of these two correction processes is carried out by the following stage of peak arbitration processors, shown in FIG. 3, which each receive the outputs of four adjacent ones of the RPP LUT's.

Figure 8:
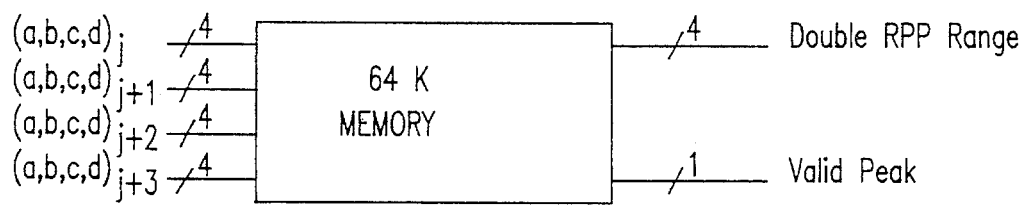
FIG. 8 is a schematic illustration of a peak arbitration look-up table of FIG. 3.
Figure 9:
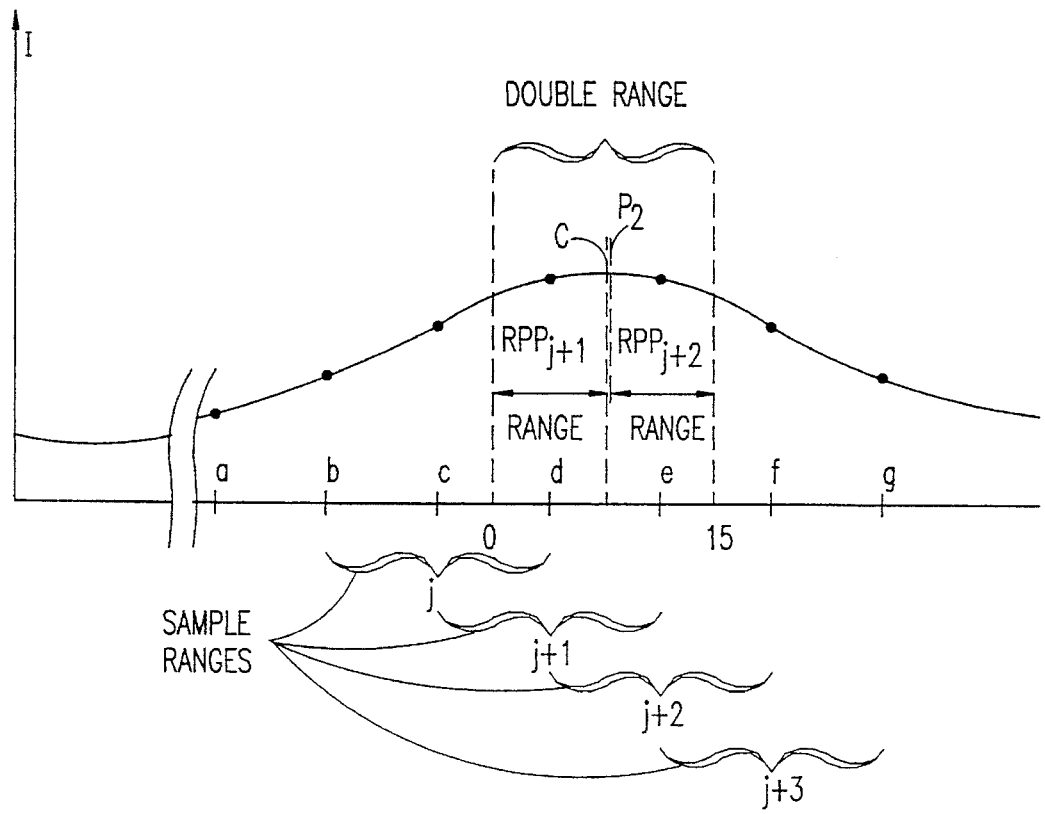
FIG. 9 illustrates operation of the peak arbitration look-up table of FIG. 8.

The organization of a preferred form of the peak arbitration LUT's is shown in FIG. 8. Since the inputs are four sets (e.g. (a, b, c, d)$_{j+1}$) of four binary values (a, b, c, d), each, from the RPP LUT's, an addressable space of 64K is required, corresponding to unique combinations of these sixteen bits. The number of bits to be output is preferably four plus one additional valid peak bit: the four bits corresponding to the original resolution within a double range, as indicated in FIG. 9, in which arbitration could possibly occur for the range covered for any one arbitration LUT. Specifically, The original samples are evaluated by the RPP LUT's in overlapping ranges of samples, indicated by the brackets labelled as sample ranges. Therefore the range of the RPP LUT's is one-half the sample range (e.g. the positional range of the samples used to determine a relative peak position). It will also be recalled from FIG. 7 that the positional resolution at the RPP LUT output was centered on the location of an original intensity sample value location and extended over four resolvable locations on either side of each such sample location. At the peak arbitration LUT stage, the outputs of four RPP LUT's are also evaluated in overlapping groups and arbitration to locate peak P2 which in this illustration is near the center, C, of the data represented in the arbitration LUT input by each arbitration LUT. This range over which arbitration LUT functions is therefore referred to as a double range and is also centered on C which will be mid-way between two of the original data samples. Because the four sample ranges overlap and the groups of ranges evaluated by each of the arbitration LUT's also overlap, each arbitration LUT can resolve a peak at any of fifteen locations in a double range. The number of peak arbitration LUT's is preferably one less than half the number of original data samples since two adjacent original samples cannot resolve more than a single peak, as is implicit from the sampling. As shown in FIG. 3, the peak arbitration LUT's are connected to overlapping ranges of RPP LUT's in order to provide continuous coverage of the zN samples. As will now be discussed in regard to FIG. 9, the connection of each peak arbitration LUT to a plurality (e.g. four) RPP LUT's also provides coverage of an overlap of sample ranges.

A broad peak of intensity values is shown in FIG. 9. The output of the j-th RPP LUT, representing three adjacent I samples, indicates a monotonically increasing intensity. The j+1th RPP LUT indicates that the peak, if any, in the j+1 range is far to the right of that range. Similarly, the j+3th RPP LUT indicates no peak by the monotonically decreasing I values and the j+2th ranges indicates the peak, if any, lies far to the left of the j+2 range. The values placed in the peak arbitration LUT are, like the other LUT's in the preferred embodiment of the invention, precomputed to resolve which of the overlapping sample ranges is considered to include the peak P2 to be reported in the double range. Therefore, further arbitration between double ranges is not required. The basis for resolving this conflict is relatively arbitrary and could be done, for example, on the basis of a comparison of the RPP outputs (e.g. in the ±3,4 ranges), the proximity of a plateau or valley or a combination of these criteria. The contents of the peak arbitration LUT's is preferably the same for all peak arbitration LUT's but in the case where RPP LUT's RPP0 and/or RPPN are not provided, 12-bit input arbitration LUT's could be used. Alternatively, default values could be supplied to 16-bit input arbitration LUT's. In any case, the important function is that the resolution of plural peaks from a single broad peak is prevented and that the RPP range be effectively converted to a double width RPP range. Therefore as a basic guideline for contents of the peak arbitration LUT, values of the RPP LUT output of, say −2 to +2 should be regenerated reflecting unchanged position but with reference to a double width range.

Figures 10, 11:
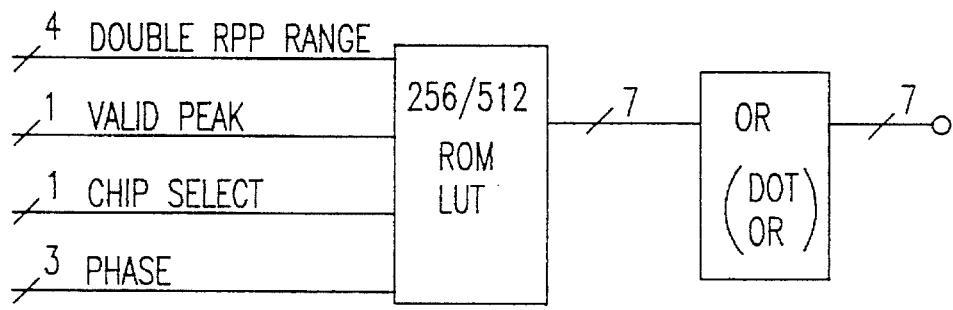
FIG. 10 is a schematic illustration of a peak gate look-up table of FIG. 3.
FIG. 11 shows an exemplary coding of data in a peak gate look-up table of FIG. 10, including data for correction of cyclically varying transducer errors.

The final stages of the preferred embodiment of the preprocessor shown is FIG. 3 is the multiplexing or peak gate LUT's, shown in FIG. 10, which are of equal number to the number of peak arbitration LUT's. Each receives the output of a corresponding peak arbitration LUT, and a threshold or chip select bit. Additionally, a further number of bits (e.g. 3) which correspond to cyclically recurring quantization errors (e.g. aliasing) of the camera used. Since these represent a limited number of bits, the addressable space is quite small, perhaps only 512 bytes or smaller if anti-aliasing is not required. In this regard, it should be noted that aliasing could cause a peak to shift between double ranges, Seven bits of output are provided in order to identify all subdivided peak positions resolvable from the original data.

It is to be understood that the function of the arbitration LUT's is two-fold. First, when a peak location may be located near adjacent ends of adjacent RPP LUT ranges, the arbitration LUT's provide resolution of a possible ambiguity which might cause two separate peaks to be reported where only one existed. Second, by providing a reduced number of double ranges, the "downstream" processing circuitry can be minimized. In this regard, each one of the RPP LUT's is potentially capable of reporting a peak within its range although the overlapping ranges of input data examined by adjacent RPP LUT's imply that adjacent RPP LUT's should not simultaneously report peaks. Therefore, only a maximum number of peaks equal to about one-half the number of RPP LUT's could be valid. Further, in practice, the anticipated number of peaks to be found is much reduced from this maximum number and as will be discussed below, only selection circuit is required for each anticipated peak.

The first of these functions could be performed in many ways such as suppressing detection or interpolating peaks which are reported within a certain proximity of each other. However, most practical approaches to this first function would result in some loss of resolution or introduction of ambiguity, particularly when the number of selection circuits is reduced to the number of peaks to be reported. Nevertheless, the inclusion of arbitration within the method and apparatus of the present invention should be regarded as a perfecting feature rather than an essential feature of the invention and selection and correction (e.g. anti-aliasing) functions, if provided, as is deemed to be preferred, could be performed directly on the outputs of the RPP LUT's. These function of selection and correction of peak location will now be described with in connection with the peak gate LUT's illustrated in FIG. 10.

The output of the peak gate LUT's is preferably controlled on the basis of two parameters: a valid peak output from the peak arbitration LUT's and a select bit. Of course, the lack of detection of a valid peak within a range should be made to suppress an output, either by placing a particular code (e.g. all zeros) at locations which could be accessed when the valid peak bit is zero or, preferably, by simply suppressing an output through the use of an AND gate array. Both suppression of an output could also be done with a similar AND gate array receiving both the select and valid peak signals. The select bit can be used for scanning or multiplexing the outputs of peak values, if any are present in a particular range, by scanning through the peak gate LUT's in sequence. Alternatively, select signals can be derived from direct evaluation of the input intensity values or the outputs of the RPP LUT outputs. In any case, the select signals merely control readout of the results derived by the processor and do not directly affect those results. Therefore the specific derivation of the select signal is not considered to be a part of this invention beyond the feature of controlling the output of the processor thereby.

Therefore, scanning through these multiplexing LUT's provides a sequential readout of any peak detected in the order of increasing or decreasing z, as desired. Thus the input to the multiplexing LUT's may be selectively transferred to the output.

It should also be noted from FIG. 3 that a plurality of banks of peak gate LUT's are preferably provided. These banks provide ease of selection of particular peaks at each pixel position if a separate bank is provided for each anticipated peak. In other words, these respective banks of peak gates, operating in parallel can effectively be used to follow a surface from pixel to pixel and the select signals used as a position threshold. While as many banks may be provided as arbitration LUT's, only two to four banks are usually required. The dot OR circuit effectively gates out the selected output for each bank.

Additionally, the multiplexing LUT's can provide further error correction if the errors are predictable. For example, as noted above, the particular camera structure with which the invention is used produces a cyclical error offset in the form of a staircased error waveform which repeats every eight data readout cycles. The step increment is proportional to the minimum resolution of the height value. Since this error is quantized and may be larger than the minimum resolution in intensity value and since the intensity sample values contain height/distance information, the error can propagate through the processor of FIG. 3.

In order to compensate for this aliasing error, the multiplexing LUT's can advantageously be supplied with a binary phase signal to access corrected or anti-aliased values from the peak gate LUT, as shown in FIG. 11. Assuming for simplicity that the aliasing error has a minimum increment equal to the value of the least significant bit of untruncated intensity or position resolution, and is otherwise regular (e.g. the same error for each step), the contents of the peak gate LUT can be arranged as shown in FIG. 11. As can be readily appreciated, for any particular double RPP range, an increment in phase (e.g. the time the sample was taken) is associated with a decrement of the value output. Thus a sample with a true RPP of 0100, referenced to a particular double range, which was taken at a time having phase of 001, the output of the arbitration gate would be offset or contain an alias and be reported as 0101 to the peak gate LUT. This would result in an output of 001000, which is the same as would be reported for the true value 0100 measured at phase 000. Note that this is true for any phase since the values on the LUT are offset such that corresponding output values occur in diagonal lines from upper left to lower right. These values need not be limited to circumstances where the increments of the alias and the increments in output are the same or to a staircased repeating pattern. Therefore, any periodically repeating quantization error may be accurately compensated to the maximum resolution of the processor.

While the invention has been described in terms of a single preferred embodiment, those skilled in the art will recognize that the invention can be practiced with modification within the spirit and scope of the appended claims. For example, for reclocking or to prevent errors resulting from propagation delays through the system, registers could be provided between any or all stages of the processor without altering the basic mode of operation as described above.

Having thus described my invention, what I claim as new and desire to secure by Letters Patent is as follows:

1. A data processor including means for receiving a plurality of parallel inputs and normalizing means for normalizing at least one of said plurality of parallel inputs by an adjacent one of said plurality of parallel inputs.

2. A data processor as recited in claim 1, wherein said normalizing means for normalizing at least one of said plurality of parallel inputs by an adjacent one of said plurality of parallel inputs comprises a memory containing precomputed normalized values addressable by said at least one of said plurality of parallel inputs and said adjacent one of said plurality of parallel inputs.

3. A data processor as recited in claim 2, wherein each of at least two of said plurality of parallel inputs are normalized by said normalizing means and said normalizing means comprises at least two memories having identical contents at corresponding addresses thereof.

4. A data processor as recited in claim 2, further including means for receiving outputs of at least a first pair of said memories of said normalizing means corresponding to three of said plurality of said input values, first and third ones of said three input values being adjacent a second, central, one of said three input values, and outputting a value corresponding to respective outputs of ones of said first pair of memories.

5. A data processor as recited in claim 4, wherein said means for receiving outputs of said first pair of said memories of said normalizing means comprises another memory addressable by outputs of respective ones of said first pair of memories.

6. A data processor as recited in claim 4, further including means for receiving outputs of at least a second pair of said memories of said normalizing means corresponding to another three of said plurality of said input values, first and third ones of said another three input values being adjacent a second, central, one of said another three input values, and outputting a value corresponding to respective outputs of ones of said second pair of memories.

7. A data processor as recited in claim 6, wherein said means for receiving outputs of said second pair of said memories of said normalizing means comprises another memory addressable by outputs of respective ones of said second pair of memories.

8. A data processor as recited in claim 7, wherein said another memory addressable by said outputs of said first pair of memories of said normalizing means and said another memory addressable by said outputs of said second pair of memories of said normalizing means having identical data stored at corresponding locations thereof.

9. A data processor as recited in claim 8, wherein said first pair of said memories of said normalizing means and said second pair of memories of said normalizing means both include a particular one of said memories of said normalizing means.

10. A data processor as recited in claim 7, wherein said first pair of said memories of said normalizing means and said second pair of said memories of said normalizing means both include a particular one of said memories of said normalizing means.

11. A data processor as recited in claim 7, further including means for receiving outputs of at least first, second and third ones of said memories receiving inputs from respective pairs of memories of said normalizing means and outputting a value corresponding to outputs of said first, second and third ones of said memories.

12. A data processor as recited in claim 11, wherein said first one of said at least first, second and third ones of said memories and said second one of said at least first, second and third ones of said memories receive inputs from one memory of said normalizing means, in common, and said second one of said at least first, second and third ones of said memories and said third one of said at least first, second and third ones of said memories receive inputs from another memory of said normalizing means, in common.

13. A data processor as recited in claim 11, further including a plurality of said means for receiving outputs of said at least first, second and third memories, and means for selecting an output of at least one of said plurality of said means for receiving outputs of said at least first, second and third memories.

14. A data processor as recited in claim 13, said means for selecting further includes means for substituting a signal for said output corresponding to said output and another signal.

15. A data processor as recited in claim 14, wherein said means for substituting a signal includes an additional memory addressable by said output and said another signal.

16. A data processor including first means for receiving a plurality of inputs in parallel and producing a first plurality of outputs in response thereto, each output of said first plurality of outputs corresponding to respective pairs of said inputs, second means for receiving said first outputs of said first means in parallel and producing a second plurality of outputs in response thereto, each output of said second plurality of outputs corresponding to respective pairs of said first outputs, and third means for receiving said second outputs of said second means in parallel and producing a third plurality of outputs in response thereto, each output of said third plurality of outputs corresponding to respective groups of at least three of said second outputs.

17. A data processor as recited in claim 16, wherein at least one of said first, second and third means comprises a plurality of memories.

18. A data processor as recited in claim 16, wherein at least one of said first, second and third means comprises a plurality of memories having identical contents in corresponding locations of each of said plurality of memories.

19. A data processor as recited in claim 16, wherein each of said first, second and third means comprises a plurality of memories.

20. A data processor as recited in claim 16, wherein at least one of said first, second and third means comprises a plurality of memories having identical contents in corresponding locations of each of said plurality of memories.

21. A data processor as recited in claim 16, further including fourth means for selecting at least one output of said third means.

22. A data processor as recited in claim 21, wherein said fourth means includes means for substituting a signal corresponding to said output of said third means for said output of said third means.

23. A data processor as recited in claim 16 wherein
said first means includes normalizing means,
said second means includes parabola fitting means, and
said third means includes arbitration means.

24. A data processor as recited in claim 23, wherein said normalizing means, said parabola fitting means and said arbitration means each comprise a plurality of memories, each memory of each of said normalizing means, said parabola fitting means and said arbitration means storing precomputed values of each combination of possible inputs thereto.

25. A data processing method including the steps of
normalizing each of a plurality of inputs by accessing a precomputed value with respective pairs of a plurality of parallel inputs, and
determining at least one location by parabola fitting by accessing a precomputed value with respective pairs of results of said normalizing step.

26. A method as recited in claim 25, including the further step of
arbitrating between results of said determining step by accessing precomputed values from memory with groups of results of said determining step.

27. A method as recited in claim 26, including the further step of
selecting at least one results of said determining step.

28. A method as recited in claim 27, including the further step of
correcting said results of said determining step.

29. A method as recited in claim 28, wherein said correcting step includes
accessing a memory with results of one of said determining, arbitrating and selecting steps and at least one additional signal.

\* \* \* \* \*